US012745456B2

(12) United States Patent
Cheng

(10) Patent No.: US 12,745,456 B2
(45) Date of Patent: Sep. 22, 2026

(54) COMPOSITE SUBSTRATE, MANUFACTURING METHOD THEREOF AND SEMICONDUCTOR DEVICE

(71) Applicant: Enkris Semiconductor (Wuxi), Ltd., Wuxi (CN)

(72) Inventor: Kai Cheng, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 420 days.

(21) Appl. No.: 18/355,656

(22) Filed: Jul. 20, 2023

(65) Prior Publication Data

US 2024/0413163 A1 Dec. 12, 2024

(30) Foreign Application Priority Data

Jun. 8, 2023 (CN) ......................... 202310679445.6

(51) Int. Cl.
*H10D 86/00* (2025.01)
*H10P 90/00* (2026.01)
*H10W 10/10* (2026.01)

(52) U.S. Cl.
CPC ....... *H10D 86/201* (2025.01); *H10P 90/1916* (2026.01); *H10W 10/181* (2026.01)

(58) Field of Classification Search
CPC ............. H10P 90/1914; H10P 90/1916; H10P 90/1918; H10P 10/00; H10P 10/12; H10P 10/14; H10D 86/201; H10W 10/181; H10W 80/00; H10L 21/76251; H10H 20/018
See application file for complete search history.

(56) References Cited

U.S. PATENT DOCUMENTS 9,331,149 B2 * 5/2016 Tong ...................... H10D 84/82
2002/0173118 A1 * 11/2002 Dietrich .............. H10P 90/1906 438/455
2004/0126985 A1 * 7/2004 Bendernagel ........... H10P 95/90 257/E21.563
2007/0200144 A1 * 8/2007 Aspar ................. B81C 1/00357 257/E21.567
2021/0384070 A1 * 12/2021 Peidous .............. H10P 90/1916
2022/0051934 A1 * 2/2022 Schwarzenbach .. H10P 90/1916

FOREIGN PATENT DOCUMENTS

CN 101692436 * 4/2010 ........... H01L 21/762
CN 112289852 * 1/2021 .......... H10W 10/181
FR 2906078 * 3/2008 .......... H10W 10/181

* cited by examiner

*Primary Examiner* — Mary A Wilczewski
(74) *Attorney, Agent, or Firm* — Westbridge IP LLC

(57) ABSTRACT

A composite substrate includes a supporting substrate layer, a buried layer and a growth substrate layer stacked in sequence. The buried layer is provided with a plurality of grooves at least partially penetrating the buried layer, the supporting substrate layer includes a charge trapping region beneath the plurality of grooves, and on a plane where the supporting substrate layer is located, shapes of projections of the charge trapping region and a corresponding groove overlap. The charge trapping region is arranged on the supporting substrate layer, and the charge trapping region is used to deplete charges of the supporting substrate layer, so as to increase resistivity of the composite substrate, reducing an impact of crosstalk; and the buried layer is provided with grooves, which may attenuate a stress transmitted from the growth substrate layer to the supporting substrate layer, so as to enhance a mechanical strength of the composite substrate.

19 Claims, 7 Drawing Sheets

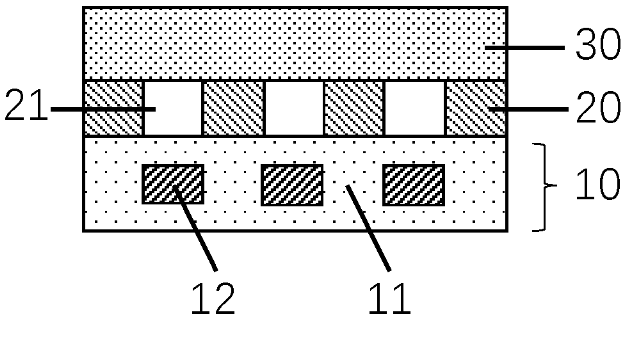
FIG. 1a
FIG. 1b
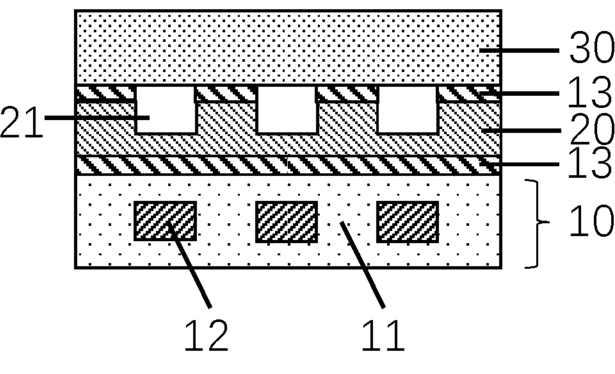
FIG. 2

COMPOSITE SUBSTRATE, MANUFACTURING METHOD THEREOF AND SEMICONDUCTOR DEVICE

CROSS-REFERENCE TO RELATED APPLICATIONS

The present disclosure claims priority to Chinese Patent Application No. 202310679445.6, filed on Jun. 8, 2023, the entire content of which is incorporated herein by reference.

TECHNICAL FIELD

The present disclosure relates to the field of semiconductor technologies, and in particular, to a composite substrate, a manufacturing method thereof and a semiconductor device.

BACKGROUND

A typical substrate structure with an insulating buried layer includes three layers, in turn, a support layer, an insulating layer on a surface of the support layer, and a device layer on a surface of the insulating layer.

If the above-mentioned substrate is used in the field of a radio frequency, more stringent requirements are placed on electrical properties of the substrate, and once the electrical properties of the substrate do not meet the requirements, radio frequency losses may occur.

SUMMARY

In view of this, embodiments of the present disclosure provide a composite substrate, a manufacturing method thereof, and a semiconductor device to solve technical problems of radio frequency losses of a substrate with an insulating buried layer in the related technologies.

According to one aspect of the present disclosure, an embodiment of the present disclosure provides a composite substrate, including: a supporting substrate layer; a buried layer patterned on the supporting substrate layer, the buried layer being provided with a plurality of grooves arranged at intervals and at least partially penetrating the buried layer; and a growth substrate layer on the buried layer. The supporting substrate layer includes a charge trapping region beneath the plurality of grooves, and on a plane where the supporting substrate layer is located, shapes of projections of the charge trapping region and a corresponding groove overlap.

As an optional embodiment, the composite substrate further includes: a metal silicide layer enclosing an upper surface and a lower surface of the buried layer.

As an optional embodiment, an ion is doped in a material of the charge trapping region, and a variation trend, along a direction away from the growth substrate layer, of a content of the ion doped in the material of the charge trapping region includes one of the followings: increasing, decreasing or first increasing and then decreasing.

As an optional embodiment, a direction perpendicular to the plane where the supporting substrate layer is located, a cross-sectional shape of the charge trapping region includes at least one of a rectangle, a triangle, a trapezoidal shape or a water droplet shape.

As an optional embodiment, on the plane where the supporting substrate layer is located, shapes of projections of the plurality of grooves include at least one of a triangle, a circle, an ellipse, a polygon, a strip or a mesh.

As an optional embodiment, a quantity of the plurality of the grooves per unit area gradually decreases from a center of the composite substrate to an edge of the composite substrate.

As an optional embodiment, on the plane where the supporting substrate layer is located, areas of projections of the plurality of grooves gradually decrease from a center of the composite substrate to an edge of the composite substrate.

As an optional embodiment, thickness of the charge trapping region is less than or equal to that of the supporting substrate layer.

As an optional embodiment, the supporting substrate layer further includes a substrate structure region enclosing the charge trapping region, a conductivity type of the substrate structure region is an n type or a p type, and a conductivity type of the charge trapping region is opposite to that of the substrate structure region.

As an optional embodiment, a positional relationship between the charge trapping region, the substrate structure region and the supporting substrate layer includes any one of the following positional relationships: the charge trapping region being located inside the supporting substrate layer, and the substrate structure region enclosing an upper surface, a lower surface and a side wall of the charge trapping region; the charge trapping region penetrating the supporting substrate layer, and the substrate structure region enclosing a side wall of the charge trapping region; or the charge trapping region partially penetrating the supporting substrate layer, and the substrate structure region enclosing a lower surface and a side wall of the charge trapping region.

As an optional embodiment, a material of the substrate structure region has a resistivity of at least 100 Ohm·cm.

As an optional embodiment, a material of the substrate structure region includes high-resistivity silicon.

As an optional embodiment, a material of the supporting substrate layer has a resistivity of at least 1000 Ohm·cm.

As an optional embodiment, materials of the supporting substrate layer and the growth substrate layer include silicon.

As an optional embodiment, a material of the buried layer includes at least one of silicon oxide, silicon nitride, silicon oxynitride or aluminum nitride.

According to another aspect of the present disclosure, an embodiment of the present disclosure provides a method for manufacturing a composite substrate, including the following steps: S1. providing a supporting substrate layer; S2. forming a buried layer on the supporting substrate layer; S3. etching to pattern the buried layer to form a plurality of grooves arranged at intervals and at least partially penetrating the buried layer; S4. forming a charge trapping region, beneath the plurality of grooves, in the supporting substrate layer, on a plane where the supporting substrate layer is located, shapes of projections of the charge trapping region and a corresponding groove overlapping; and S5. bonding a growth substrate layer on a side, away from the supporting substrate layer, of the buried layer.

As an optional embodiment, the step S4 includes: forming, by using ion-implantation, the charge trapping region, beneath the plurality of grooves, in the supporting substrate layer, and a change in a content of an ion doped in a material of the charge trapping region, depth and thickness of the charge trapping region are controlled by controlling energy of the ion-implantation.

As an optional embodiment, when the buried layer is penetrated by the plurality of grooves such that a surface of the supporting substrate layer is exposed by the plurality of grooves, the step S4 includes: etching the surface, exposed by the plurality of grooves, of the supporting substrate layer to form a pit; and epitaxially growing the charge trapping region in the pit.

As an optional embodiment, when the buried layer is penetrated by the plurality of grooves such that a surface of the supporting substrate layer is exposed by the plurality of grooves, the step S4 includes: filling the plurality of grooves with a heavily doped semiconductor layer; forming, by a diffusion effect, the charge trapping region beneath the heavily doped semiconductor layer; and removing the heavily doped semiconductor layer.

According to another aspect of the present disclosure, an embodiment of the present disclosure provides a semiconductor device, including: a composite substrate as described in any of the previous embodiments.

BRIEF DESCRIPTION OF THE DRAWINGS

FIGS. 1*a* and 1*b* are schematic structural diagrams of a composite substrate according to an embodiment of the present disclosure.

FIG. 2 is a schematic structural diagram of a composite substrate according to an embodiment of the present disclosure.

DETAILED DESCRIPTION OF THE EMBODIMENTS

Figure 3A:
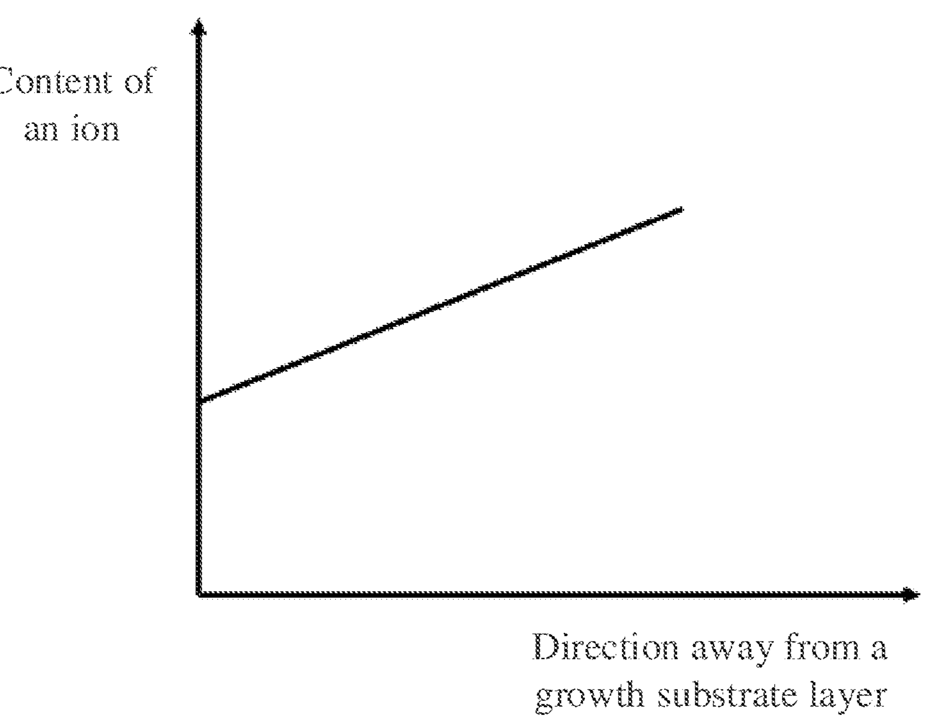
FIGS. 3*a* to 3*c* are schematic variation diagrams of a content of an ion doped in a material of a charge trapping region according to an embodiment of the present disclosure.

The technical solutions in the embodiments of the present disclosure are described hereinafter clearly and completely, with reference to accompanying drawings in the embodiments of the present disclosure. Apparently, the described embodiments are only a part, but not all, of the embodiments of the present disclosure. All of the other embodiments that are obtained by those of ordinary skill in the art based on the embodiments in the disclosure without any inventive efforts fall into the scope protected by the present disclosure.

In the related technologies, transmission of radio frequency signals in a device layer may generate a parasitic circuitry in a support layer and is thereby subjected to crosstalk from the support layer. Moreover, as frequency increases, the effect of the crosstalk becomes more pronounced, resulting in a relatively high radio frequency loss.

To solve the technical problems of radio frequency losses in a substrate with an insulating buried layer in the related technologies, it is necessary to provide a composite substrate, a manufacturing method thereof and a semiconductor device, so as to improve resistivity of a semiconductor device, thereby reducing an impact of the crosstalk to prepare a high-frequency and low-loss semiconductor device.

The present disclosure provides a composite substrate, a manufacturing method thereof, and a semiconductor device. The composite substrate includes a supporting substrate layer, a buried layer and a growth substrate layer which are stacked in sequence, the buried layer is provided with a plurality of grooves at least partially penetrating the buried layer, the supporting substrate layer includes a charge trapping region beneath the plurality of grooves, and on a plane where the supporting substrate layer is located, shapes of projections of the charge trapping region and a corresponding groove overlap. In the composite substrate provided in the present disclosure, the charge trapping region is arranged on the supporting substrate layer, and the charge trapping region can be used to deplete charges of the supporting substrate layer, so as to increase resistivity of the composite substrate, reducing an impact of crosstalk to prepare semiconductor devices with high-frequency and low-loss; and the buried layer is provided with the plurality of grooves, which may attenuate a stress transmitted from the growth substrate layer to the supporting substrate layer, so as to enhance a mechanical strength of the composite substrate, preventing deformation during a subsequent epitaxial process.

The composite substrate, the manufacturing method thereof and a semiconductor device mentioned in the present disclosure are further illustrated with reference to FIGS. 1 to 13.

FIGS. 1*a* and 1*b* are schematic structural diagrams of a composite substrate according to an embodiment of the present disclosure. The composite substrate includes a supporting substrate layer 10; a buried layer 20 patterned on the supporting substrate layer 10, the buried layer 20 provided with a plurality of grooves 21 arranged at intervals and at least partially penetrating the buried layer 20; and a growth substrate layer 30 on the buried layer 20. The supporting substrate layer 10 includes a charge trapping region 12 beneath the plurality of grooves 21, and on a plane where the supporting substrate layer 10 is located, shapes of projections of the charge trapping region 12 and a corresponding groove 21 overlap. The buried layer 20 may be fully penetrated by the plurality of grooves 21, as shown in FIG. 1*a*; and the buried layer 20 may also be partially penetrated by the plurality of grooves 21, as shown in FIG. 1*b*.

In an embodiment, FIG. 2 is a schematic structural diagram of a composite substrate according to an embodiment of the present disclosure. As shown in FIG. 2, the composite substrate further includes a metal silicide layer 13 enclosing an upper surface and a lower surface of the buried layer 20. Due to presence of interface states at an interface between silicon and silicon dioxide, mobile charges may be introduced, causing radio frequency losses at high frequencies. Therefore, the metal silicide layer 13 is used to enclose the buried layer 20, so that the radio frequency losses caused by the interface states between the buried layer 20 and the growth substrate layer 30, as well as the interface states between the buried layer 20 and the supporting substrate layer 10, can be avoided.

In an embodiment, the supporting substrate layer 10 further includes a substrate structure region 11 enclosing the charge trapping region 12, a material of the substrate structure region 11 includes high resistivity silicon, and a conductivity type of the substrate structure region 11 is an n type or a p type, which is opposite to the conductivity type of the charge trapping region 12. The conductivity types of the charge trapping region 12 and the substrate structure region 11 are set opposite, so that a depletion layer is formed, to deplete charges of the supporting substrate layer 10, increasing resistivity of the supporting substrate layer 10. A material of the substrate structure region 11 has a resistivity of at least 100 Ohm·cm, and the depletion layer is formed, so that a material of the supporting substrate layer 10 may be made to have a resistivity of at least 1000 Ohm·cm.

Figure 3B:
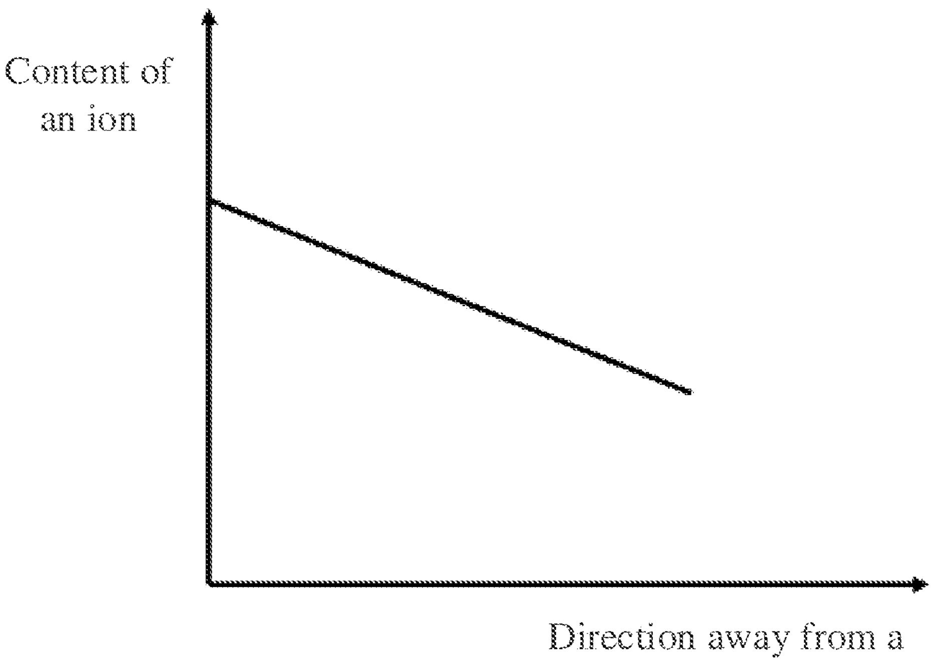
Figure 3C:
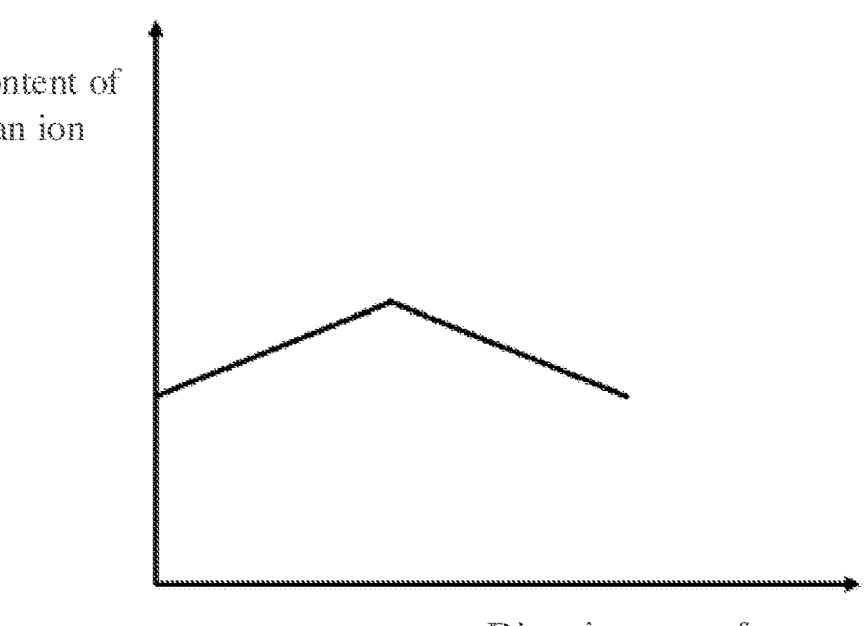

In an embodiment, FIGS. 3*a* to 3*c* are schematic variation diagrams of a content of an ion doped in a material of a charge trapping region according to an embodiment of the present disclosure. An ion is doped in a material of the charge trapping region 12, and a variation trend, along a direction away from the growth substrate layer 30, of a content of the ion doped in the material of the charge trapping region 12 includes one of the following: increasing (shown in FIG. 3*a*), decreasing (shown in FIG. 3*b*), or first increasing and then decreasing (shown in FIG. 3*c*). The content of the ion doped in the material of the charge trapping region 12 is designed, so that charge distribution of the charge trapping region 12 can be improved, further enhancing insulating effect of the depletion layer, so as to increase the resistivity of the composite substrate.

Figure 4A:
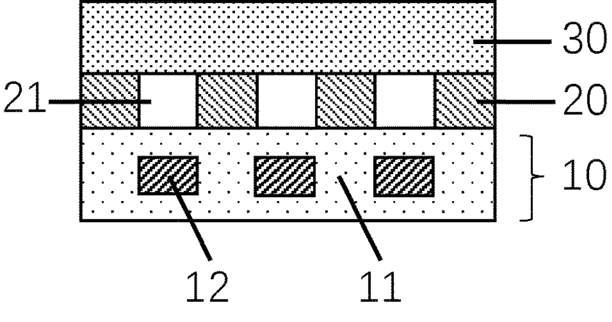
FIGS. 4*a* to 4*c* are schematic structural diagrams of a composite substrate according to an embodiment of the present disclosure.
Figure 4B:
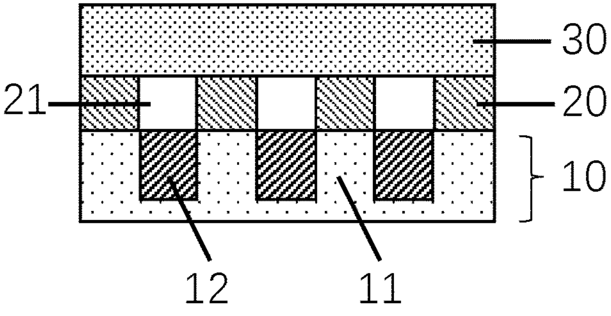
Figure 4C:
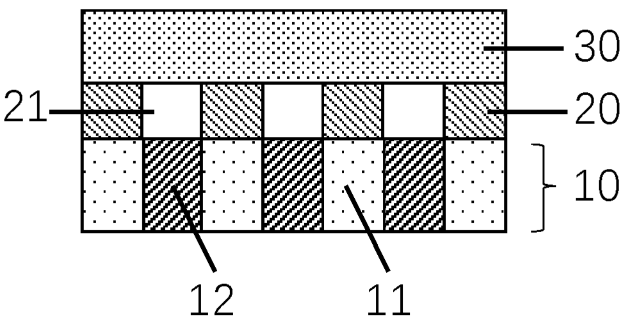

In an embodiment, FIGS. 4*a* to 4*c* are schematic structural diagrams of a composite substrate according to an embodiment of the present disclosure. Thickness of the charge trapping region 12 is less than or equal to that of the supporting substrate layer 10. When the thickness of the charge trapping region 12 is less than that of the supporting substrate layer 10, the charge trapping region 12 is located inside the supporting substrate layer 10, and an upper surface, a lower surface, and a side wall of the charge trapping region 12 are enclosed by the substrate structure region 11 (shown in FIG. 4*a*), or the supporting substrate layer 10 is partially penetrated by the charge trapping region 12, and a lower surface and a side wall of the charge trapping region 12 are enclosed by the substrate structure region 11 (shown in FIG. 4*b*). When the thickness of the charge trapping region 12 is equal to that of the supporting substrate layer 10, the supporting substrate layer 10 is penetrated by the charge trapping region 12, and the side wall of the charge trapping region 12 is enclosed by the supporting substrate layer 10 (shown in FIG. 4*c*). When the charge trapping region 12 is located inside the supporting substrate layer 10, crystal quality of a surface of the supporting substrate layer 10 is relatively high, which is beneficial for subsequent growth of epitaxial layers; and when the supporting substrate layer 10 is penetrated by the charge trapping region 12, the charges of the supporting substrate layer 10 are depleted more thoroughly, further increasing the resistivity of the composite substrate.

Figure 5A:
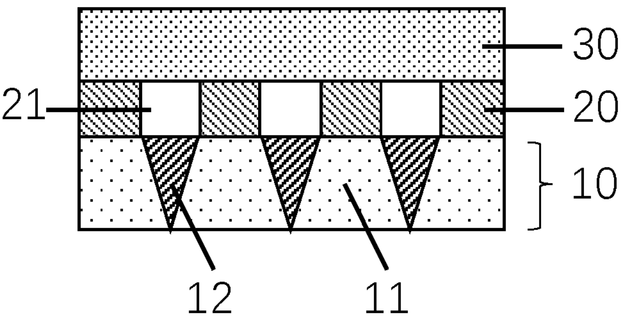
FIGS. 5*a* to 5*c* are schematic structural diagrams of a composite substrate according to an embodiment of the present disclosure.
Figure 5B:
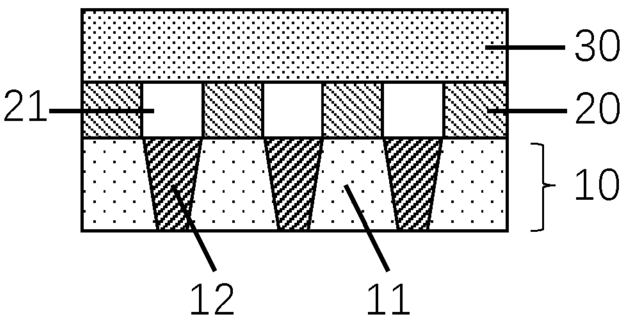
Figure 5C:
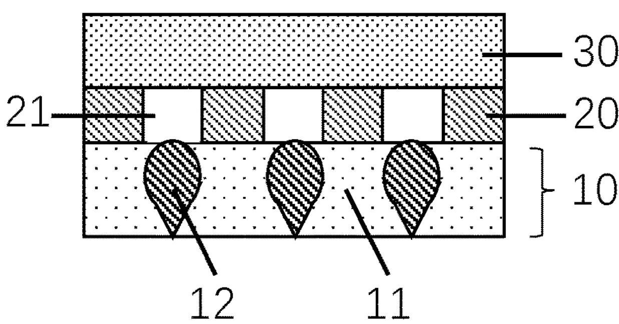

In an embodiment, FIGS. 5*a* to 5*c* are schematic structural diagrams of a composite substrate according to an embodiment of the present disclosure. In a direction perpendicular to the plane where the supporting substrate layer 10 is located, a cross-sectional shape of the charge trapping region 12 includes at least one of a rectangle, a triangle, a trapezoidal shape or a water droplet shape. The cross-sectional shape of the charge trapping region 12 may be the rectangle (shown in FIG. 4*c*), the triangle (shown in FIG. 5*a*), the trapezoidal shape (shown in FIG. 5*b*) and the water droplet shape (shown in FIG. 5*c*), and the cross-sectional shape of the charge trapping region 12 is not specifically limited in the present disclosure.

In an embodiment, on the plane where the supporting substrate layer 10 is located, shapes of projections of the plurality of grooves 21, penetrating the buried layer 20, includes at least one of a triangle, a circle, an ellipse, a polygon, a strip or a mesh. On the plane where the supporting substrate layer 10 is located, the shapes of the projections of the charge trapping region 12 and the corresponding groove 21 overlap. The shape of the charge trapping region 12 is controlled by controlling the shapes of the plurality of grooves 21, so that a plurality of charge trapping regions 12 are uniformly distributed in the supporting substrate layer 10, to uniformly deplete the charges of the supporting substrate layer 10, thereby increasing the resistivity of the composite substrate. Setting the buried layer 20 provided with the plurality of grooves 21 may also attenuate the stress transmitted from the growth substrate layer 30 to the supporting substrate layer 10, so as to enhance a mechanical strength of the composite substrate, preventing deformation during a subsequent epitaxial process.

Figure 6A:
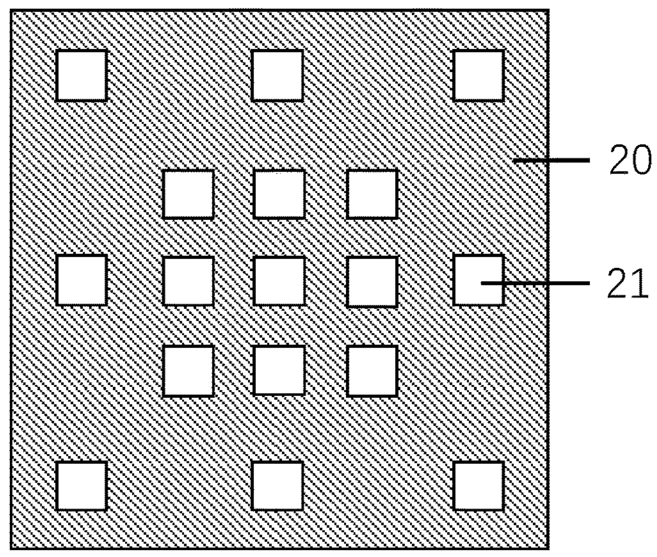
FIGS. 6*a* and 6*b* are schematic top view diagrams of a buried layer according to an embodiment of the present disclosure.
Figure 6B:
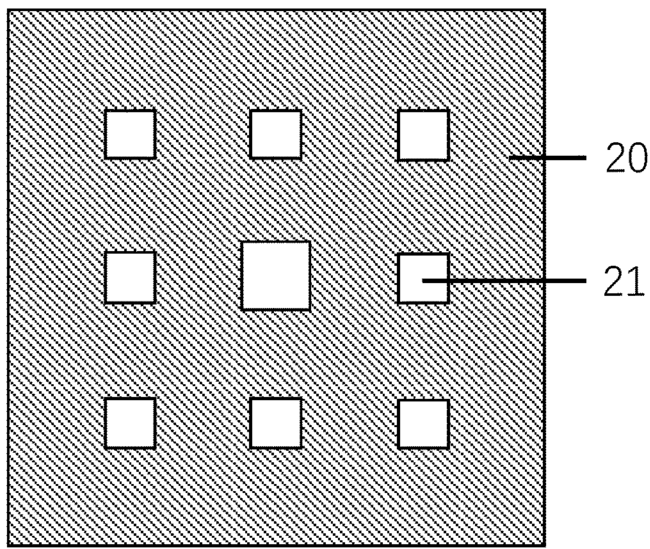

In an embodiment, FIGS. 6*a* and 6*b* are schematic top view diagrams of a buried layer according to an embodiment of the present disclosure. A quantity of the grooves 21, penetrating the buried layer 20, per unit area gradually decreases from a center of the composite substrate to an edge of the composite substrate (shown in FIG. 6*a*), or on the plane where the supporting substrate layer 10 is located, areas of projections of the plurality of grooves 21, penetrating the buried layer 20, gradually decreases from a center of the composite substrate to an edge of the composite substrate (shown in FIG. 6*b*). The number or size of the plurality of grooves 21 are designed, so that, on the one hand, stress distribution of the composite substrate may be adjusted to increase the mechanical strength of the composite substrate, on the other hand, the number or size of the charge trapping regions 12 may be adjusted to improve the charge distribution of the charge trapping regions 12 in the supporting substrate layer 10, further enhancing charge depletion effect to increase the resistivity of the composite substrate.

In an embodiment, materials of the supporting substrate layer 10 and the growth substrate layer 30 includes silicon. The supporting substrate layer 10 has a (111) crystal orientation or a (100) crystal orientation, and the growth substrate layer 30 has a (111) crystal orientation. The growth substrate layer 30 is used for subsequent growth of the epitaxial layers to prepare a semiconductor structure, and a (111) crystal plane of a single crystal silicon is more favorable for epitaxial growth of an epitaxial structure layer made of a group III-V compound material.

In an embodiment, a material of the buried layer 20 includes at least one of silicon oxide, silicon nitride, silicon oxynitride or aluminum nitride. The material of the buried layer 20 is a polar material, and the polar material refers to a material having polar bonds therein, such as metal oxides/nitrides, non-metal oxides/nitrides, and compound semiconductors. The polar bonds in the polar material are exposed on a surface of the polar material for bonding, which facilitates formation of a more robust bonding interface. The material of the buried layer 20 is selected from at least one of silicon oxide, silicon nitride, silicon oxynitride or aluminum nitride, the above-mentioned materials are commonly used as both insulating materials and polar materials that take into account both insulating and bonding properties.

Figures 7, 8, 9:
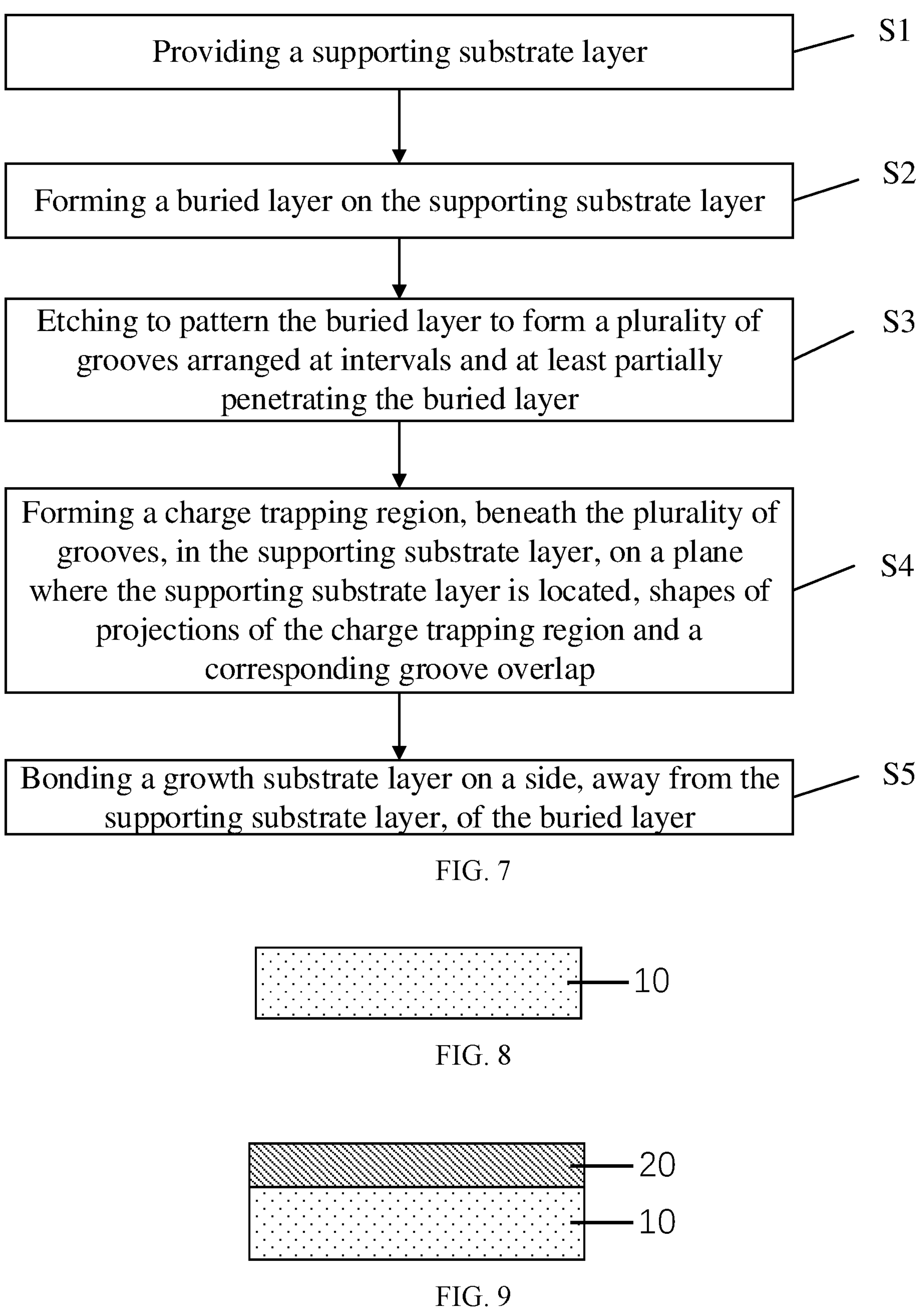
FIG. 7 is a flow diagram of a method for manufacturing a composite substrate according to an embodiment of the present disclosure.
FIGS. 8 to 13 are schematic structural diagrams of an intermediate structure produced during a manufacturing process of a composite substrate according to an embodiment of the present disclosure.

An embodiment of the present disclosure also provides a method for manufacturing a composite substrate, FIG. 7 is a flow diagram of a method for manufacturing a composite substrate according to an embodiment of the present disclosure, and FIGS. 8 to 13 are schematic structural diagrams of an intermediate structure produced during a manufacturing process of a composite substrate according to an embodiment of the present disclosure, as shown in FIG. 7, the method includes the following steps.

Step S1: as shown in FIG. 8, providing a supporting substrate layer 10. A material of the support substrate 10 includes silicon. The supporting substrate layer 10 has a (111) crystal orientation or a (100) crystal orientation.

Step S2: as shown in FIG. 9, forming a buried layer 20 on the supporting substrate layer 10. A material of the buried layer 20 includes at least one of silicon oxide, silicon nitride, silicon oxynitride or aluminum nitride. A preparation method for the buried layer 20 includes thermal oxidation or low-pressure chemical deposition. When the material of the buried layer 20 is silicon dioxide, the thermal oxidation may be performed on the supporting substrate layer 10, to form the buried layer 20 on an upper surface of the supporting substrate layer 10. The buried layer 20 made of a material of silicon oxide, silicon nitride, silicon oxynitride or aluminum nitride may also be formed on the supporting substrate layer 10 by using the low-pressure chemical deposition.

In an embodiment, metal deposition may be performed before and after the step S2, to enclose an upper surface and a lower surface of the buried layer 20, and a metal silicide layer 13 enclosing the buried layer 20 is formed after annealing, to solve the problems of the radio frequency losses caused by the interface states between the silicon and the silicon dioxide.

Figure 10:
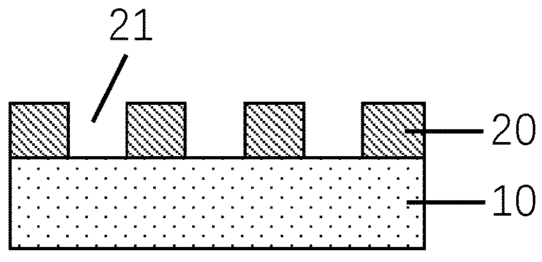

Step S3: as shown in FIG. 10, etching to pattern the buried layer 20 to form a plurality of grooves 21 arranged at intervals and at least partially penetrating the buried layer 20. On a plane where the supporting substrate layer 10 is located, shapes of projections of the plurality of grooves 21 includes at least one of a triangle, a circle, an ellipse, a polygon, a strip or a mesh.

Figure 11:
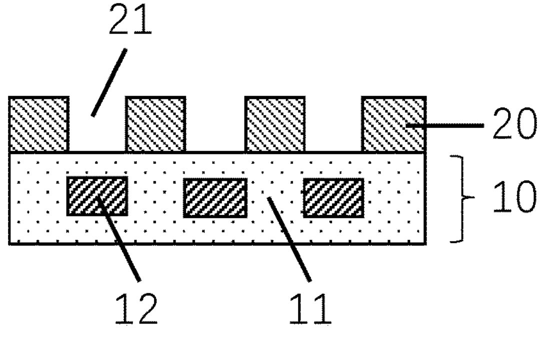
Figure 12:
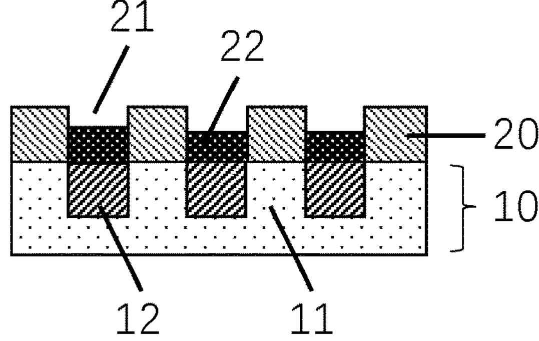

Step S4: as shown in FIG. 11, forming a charge trapping region 12, beneath the plurality of grooves 21, in the supporting substrate layer 10, on the plane where the supporting substrate layer 10 is located, shapes of projections of the charge trapping region 12 and a corresponding groove 21 overlapping. The supporting substrate layer 10 further includes a substrate structure region 11 enclosing the charge trapping region 12. A conductivity type of the substrate structure region 11 is an n type or a p type, and a conductivity type of the charge trapping region 12 is opposite to that of the substrate structure region 11.

In an embodiment, the step S4 includes: forming, by using ion-implantation, the charge trapping region 12, beneath the plurality of grooves 21, in the supporting substrate layer 10, and a change in a content of an ion doped in a material of the charge trapping region 12, depth and thickness of the charge trapping region 12 are controlled by controlling energy of the ion-implantation. By controlling the energy of the ion-implantation, a variation trend, along a direction away from the growth substrate layer 30, of a content of the ion doped in the material of the charge trapping region 12 may be controlled to be increasing (shown in FIG. 3*a*), decreasing (shown in FIG. 3*b*), or first increasing and then decreasing (shown in FIG. 3*c*). The content of the ion doped in the material of the charge trapping region 12 is designed, so that charge distribution of the charge trapping region 12 can be improved, further enhancing insulating effect of a depletion layer, so as to increase resistivity of the composite substrate. The depth and the thickness of the charge trapping region 12 may also be controlled by controlling the energy of the ion-implantation. The thickness of the charge trapping region 12 is less than or equal to a thickness of the supporting substrate layer 10. When the thickness of the charge trapping region 12 is less than the thickness of the supporting substrate layer 10, the charge trapping region 12 is located inside the supporting substrate layer 10, an upper surface, a lower surface and a side wall of the charge trapping region 12 are enclosed by the substrate structure region 11 (shown in FIG. 4*a*), or the supporting substrate layer 10 is partially penetrated by the charge trapping region 12, and a lower surface and a side wall of the charge trapping region 12 are enclosed by the substrate structure region 11 (shown in FIG. 4*b*). When the thickness of the charge trapping region 12 is equal to the thickness of the supporting substrate layer 10, the supporting substrate layer 10 is penetrated by the charge trapping region 12, and the side wall of the charge trapping region 12 is enclosed by the substrate structure region 11 (shown in FIG. 4*c*). When the charge trapping region 12 is located inside the supporting substrate layer 10, crystal quality of a surface of the supporting substrate layer 10 is improved, which is beneficial for subsequent growth of epitaxial layers; and when the supporting substrate layer 10 is penetrated by the charge trapping region 12, charges of the supporting substrate layer 10 are depleted more thoroughly, further increasing the resistivity of the composite substrate. The patterned buried layer 20 may be directly used as a mask for the ion-implantation to control the shape of the projection of the charge trapping region 12 formed by the ion-implantation to be the same as that of the corresponding groove 21, thereby eliminating a need for an additional mask layer, to simplify a process as well as reducing costs.

In another embodiment, when the buried layer 20 is penetrated by the plurality of grooves 21 such that a surface of the supporting substrate layer 10 is exposed by the plurality of grooves 21, the step S4 includes: etching the surface, exposed by the plurality of grooves 21, of the supporting substrate layer 10 to form a pit; and epitaxially growing the charge trapping region 12 in the pit.

In another embodiment, when the buried layer 20 is penetrated by the plurality of grooves 21 such that a surface of the supporting substrate layer 10 is exposed by the plurality of grooves 21, the step S4 includes: filling the plurality of grooves 21 with a heavily doped semiconductor layer 22; forming, by a diffusion effect, the charge trapping region 12 beneath the heavily doped semiconductor layer 22 (shown in FIG. 12); and removing the heavily doped semiconductor layer 22. A conductivity type of the heavily doped semiconductor layer 22 is opposite to that of the substrate structure region 11. A conductivity type of the supporting substrate layer 10 is reversed by the diffusion effect of the heavily doped semiconductor layer 22, such as aluminum metal diffusion, to form the charge trapping region 12, which may form a depletion PN junction with the substrate structure region 11. A method for forming the charge trapping region 12 is not specifically limited in the present disclosure.

In an embodiment, the shape of the charge trapping region 12 may be controlled by controlling shapes of the plurality of grooves 21. In a direction perpendicular to a plane where the supporting substrate layer 10 is located, a cross-sectional shape of the charge trapping region 12 may be a rectangle (shown in FIG. 4*c*), a triangle (shown in FIG. 5*a*), a trapezoidal shape (shown in FIG. 5*b*) or a water droplet shape (shown in FIG. 5*c*), and the cross-sectional shape of the charge trapping region 12 is not specifically limited in the present disclosure.

In an embodiment, the number and size of the charge trapping regions 12 may be controlled by controlling the number and size of the plurality of grooves 21. A quantity of the plurality of grooves 21, penetrating the buried layer 20, per unit area gradually decreases from a center of the composite substrate to an edge of the composite substrate (shown in FIG. 6*a*), or on the plane where the supporting substrate layer 10 is located, areas of projections of the plurality of grooves 21, penetrating the buried layer 20, gradually decreases from a center of the composite substrate to an edge of the composite substrate (shown in FIG. 6*b*). The number or size of the plurality of grooves 21 is designed, so that, on the one hand, stress distribution of the composite substrate may be adjusted to increase mechanical strength of the composite substrate, on the other hand, the number or size of the charge trapping regions 12 may be adjusted to improve charge distribution of the charge trapping regions 12 in the supporting substrate layer 10, further enhancing charge depletion effect to increase the resistivity of the composite substrate.

Figure 13:
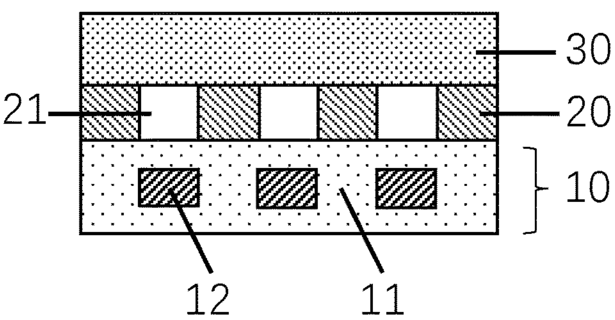

Step S5: as shown in FIG. 13, bonding a growth substrate layer 30 on a side, away from the supporting substrate layer 10, of the buried layer 20. A material of the growth substrate layer 30 includes silicon. The growth substrate layer 30 has a (111) crystal orientation. The growth substrate layer 30 is used for subsequent growth of epitaxial layers to prepare a semiconductor structure, and a (111) crystal plane of a single crystal silicon is more favorable for epitaxial growth of an epitaxial structure layer made of a group III-V compound material.

An embodiment of the present disclosure also provides a semiconductor device, including the composite substrate as described in any of the previous embodiments. The semiconductor device has the same beneficial effects as the above composite substrate, and is not described further herein, with reference to the embodiments described above.

The present disclosure provides a composite substrate, a manufacturing method thereof, and a semiconductor device. The composite substrate includes a supporting substrate layer, a buried layer and a growth substrate layer which are stacked in sequence, the buried layer is provided with a plurality of grooves at least partially penetrating the buried layer, the supporting substrate layer includes a charge trapping region beneath the plurality of grooves, and on a plane where the supporting substrate layer is located, shapes of projections of the charge trapping region and a corresponding groove overlap. In the composite substrate provided in the present disclosure, the charge trapping region is arranged on the supporting substrate layer, and the charge trapping region can be used to deplete the charges of the supporting substrate layer, so as to increase the resistivity of the composite substrate, reducing the impact of the crosstalk to prepare the semiconductor devices with high-frequency and low-loss; and the buried layer is provided with the plurality of grooves, which may attenuate the stress transmitted from the growth substrate layer to the supporting substrate layer, so as to enhance the mechanical strength of the composite substrate, preventing the deformation during the subsequent epitaxial process.

It is to be appreciated that the term "comprising" and variations thereof as used in the present disclosure are open including, i.e., "including, but not limited to". The term "an embodiment" means "at least an embodiment". In this specification, illustrative expressions of these terms do not necessarily refer to the same embodiment or example. Moreover, the described specific features, structures, materials, or characteristics may be combined in any one or more embodiments or examples in an appropriate manner. In addition, without mutual conflict, those skilled in the art may incorporate and combine different embodiments or examples and features of the different embodiments or examples described in this specification.

The foregoing is merely a preferred embodiment of the present disclosure and is not intended to limit the present disclosure, and any modifications, equivalent substitutions, and the like made within the spirit and principles of the present disclosure are intended to be included within the protection scope of the present disclosure.

What is claimed is:

1. A composite substrate, comprising:

a supporting substrate layer;

a buried layer patterned on the supporting substrate layer, the buried layer being provided with a plurality of grooves arranged at intervals and at least partially penetrating the buried layer; and a growth substrate layer on the buried layer, wherein the supporting substrate layer comprises a plurality of charge trapping regions respectively beneath the plurality of grooves, and a shape of a projection, on a plane parallel to the supporting substrate layer, of each charge trapping region at least partially overlaps a shape of a projection, on the plane, of a respective groove; and the supporting substrate layer further comprises a substrate structure region enclosing the charge trapping region, a conductivity type of the substrate structure region is an n type or a p type, and a conductivity type of the charge trapping region is opposite to that of the substrate structure region.

2. The composite substrate according to claim 1, further comprising:

a metal silicide layer enclosing an upper surface and a lower surface of the buried layer.

3. The composite substrate according to claim 1, wherein an ion is doped in a material of the charge trapping region, and a variation trend, along a direction away from the growth substrate layer, of a content of the ion doped in the material of the charge trapping region comprises one of the followings: increasing, decreasing or first increasing and then decreasing.

4. The composite substrate according to claim 1, wherein in a direction perpendicular to the plane, a cross-sectional shape of the charge trapping region comprises at least one of a rectangle, a triangle, a trapezoidal shape or a water droplet shape.

5. The composite substrate according to claim 1, wherein on the plane, shapes of projections of the plurality of grooves comprise at least one of a triangle, a circle, an ellipse, a polygon, a strip or a mesh.

6. The composite substrate according to claim 1, wherein a quantity of the plurality of grooves per unit area gradually decreases from a center of the composite substrate to an edge of the composite substrate.

7. The composite substrate according to claim 1, wherein on the plane, areas of projections of the plurality of grooves gradually decrease from a center of the composite substrate to an edge of the composite substrate.

8. The composite substrate according to claim 1, wherein a thickness of the charge trapping region is less than or equal to that of the supporting substrate layer.

9. The composite substrate according to claim 1, wherein a positional relationship between the charge trapping region, the substrate structure region and the supporting substrate layer comprises any one of the following positional relationships:

the charge trapping region being located inside the supporting substrate layer, and the substrate structure region enclosing an upper surface, a lower surface and a side wall of the charge trapping region;

the charge trapping region penetrating the supporting substrate layer, and the substrate structure region enclosing a side wall of the charge trapping region; or the charge trapping region partially penetrating the supporting substrate layer, and the substrate structure region enclosing a lower surface and a side wall of the charge trapping region.

10. The composite substrate according to claim 1, wherein a material of the substrate structure region has a resistivity of at least 100 Ohm cm.

11. The composite substrate according to claim 1, wherein a material of the substrate structure region comprises high-resistivity silicon.

12. The composite substrate according to claim 1, wherein a material of the supporting substrate layer has a resistivity of at least 1000 Ohm cm.

13. The composite substrate according to claim 1, wherein materials of the supporting substrate layer and the growth substrate layer comprise silicon.

14. The composite substrate according to claim 1, wherein a material of the buried layer comprises at least one of silicon oxide, silicon nitride, silicon oxynitride or aluminum nitride.

15. A semiconductor device, comprising: a composite substrate, wherein the composite substrate comprises:

a supporting substrate layer;

a buried layer patterned on the supporting substrate layer, the buried layer being provided with a plurality of grooves arranged at intervals and at least partially penetrating the buried layer; and a growth substrate layer on the buried layer, wherein the supporting substrate layer comprises a plurality of charge trapping regions respectively beneath the plurality of grooves, and a shape of a projection, on a plane parallel to the supporting substrate layer, of each charge trapping region at least partially overlaps a shape of a projection, on the plane, of a respective groove; and the supporting substrate layer further comprises a substrate structure region enclosing the charge trapping region, a conductivity type of the substrate structure region is an n type or a p type, and a conductivity type of the charge trapping region is opposite to that of the substrate structure region.

16. A method for manufacturing a composite substrate, comprising the steps of:

S1: providing a supporting substrate layer;

S2: forming a buried layer on the supporting substrate layer;

S3: etching to pattern the buried layer to form a plurality of grooves arranged at intervals and at least partially penetrating the buried layer;

S4: forming a plurality of charge trapping regions, respectively beneath the plurality of grooves, in the supporting substrate layer, a shape of a projection, on a plane parallel to the supporting substrate layer, of each charge trapping region at least partially overlapping a shape of a projection, on the plane, of a respective groove; and S5: bonding a growth substrate layer on a side, away from the supporting substrate layer, of the buried layer, wherein the supporting substrate layer further comprises a substrate structure region enclosing the charge trapping region, a conductivity type of the substrate structure region is an n type or a p type, and a conductivity type of the charge trapping region is opposite to that of the substrate structure region.

17. The method according to claim 16, wherein the step S4 comprises:

forming, by using ion-implantation, the plurality of charge trapping regions, respectively beneath the plurality of grooves, in the supporting substrate layer, and a change in a content of an ion doped in a material of the charge trapping region, depth and thickness of the charge trapping region are controlled by controlling energy of the ion-implantation.

18. The method according to claim 16, wherein when the buried layer is penetrated by the plurality of grooves such that a surface of the supporting substrate layer is exposed by the plurality of grooves, the step S4 comprises:

etching the surface, exposed by the plurality of grooves, of the supporting substrate layer to form a plurality of pits; and epitaxially growing the plurality of charge trapping regions in the plurality of pits.

19. The method according to claim 16, wherein when the buried layer is penetrated by the plurality of grooves such that a surface of the supporting substrate layer is exposed by the plurality of grooves, the step S4 comprises:

filling the plurality of grooves with a heavily doped semiconductor layer;

forming, by a diffusion effect, the plurality of charge trapping regions beneath the heavily doped semiconductor layer; and removing the heavily doped semiconductor layer.

* * * * *